(12) United States Patent
Maayan et al.

(10) Patent No.: US 10,304,545 B2
(45) Date of Patent: *May 28, 2019

(54) METHODS, CIRCUITS, DEVICES, AND SYSTEMS FOR SENSING AN NVM CELL

(71) Applicant: Cypress Semiconductor Corporation, San Jose, CA (US)

(72) Inventors: Eduardo Maayan, Kfar Saba (IL); Yoram Betser, Mazkeret Batya (IL); Alexander Kushnarenko, Haifa (IL)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/995,926

(22) Filed: Jun. 1, 2018

(65) Prior Publication Data

US 2019/0035477 A1 Jan. 31, 2019

Related U.S. Application Data

(63) Continuation of application No. 14/284,632, filed on May 22, 2014, now Pat. No. 9,991,001.

(51) Int. Cl.
*G11C 16/28* (2006.01)
*G11C 8/10* (2006.01)
*G11C 11/56* (2006.01)

(52) U.S. Cl.
CPC ............ *G11C 16/28* (2013.01); *G11C 8/10* (2013.01); *G11C 11/5642* (2013.01)

(58) Field of Classification Search
CPC ....... G11C 16/28; G11C 11/5642; G11C 7/14; G11C 11/25634; G11C 16/10
See application file for complete search history.

(56) References Cited

U.S. PATENT DOCUMENTS

| 5,737,260 | A | 4/1998 | Takata et al. |
| 5,943,286 | A | 8/1999 | Orita |
| 6,226,213 | B1 | 5/2001 | Chih |
| 7,606,068 | B2 | 10/2009 | Shieh et al. |
| 2001/0033514 | A1 | 10/2001 | Takata et al. |
| 2003/0208663 | A1 | 11/2003 | Buskirk et al. |
| 2005/0047234 | A1 | 3/2005 | Kamata |
| 2008/0037336 | A1 | 2/2008 | Kouno |
| 2009/0326848 | A1 | 12/2009 | Suzuki et al. |

OTHER PUBLICATIONS

USPTO Final Rejection for U.S. Appl. No. 14/284,632 dated May 25, 2016; 12 pages.
USPTO Final Rejection for U.S. Appl. No. 14/284,632 dated Aug. 17, 2017; 15 pages.
USPTO Non-Final Rejection for U.S. Appl. No. 14/284,632 dated Dec. 9, 2015; 11 pages.
USPTO Non-Final Rejection for U.S. Appl. No. 14/284,632 dated Dec. 30, 2016; 14 pages.
USPTO Notice of Allowance for U.S. Appl. No. 14/284,632 dated Feb. 22, 2018; 8 pages.

*Primary Examiner* — Mohammed A Bashar (57) ABSTRACT

Disclosed is a non-volatile memory (NVM) device including an array of NVM cells segmented into at least a first sector and a second sector and at least one sensing circuit to sense a state of a target NVM cell in the first sector using a reference current of the second sector received from at least a dynamic reference cell.

20 Claims, 11 Drawing Sheets

METHODS, CIRCUITS, DEVICES, AND SYSTEMS FOR SENSING AN NVM CELL

CROSS-REFERENCE TO RELATED APPLICATION

This application is a Continuation of U.S. patent application Ser. No. 14/284,632, filed May 22, 2014, which is incorporated by reference herein in its entirety.

FIELD OF THE INVENTION

The present invention relates generally to the field of non-volatile memory (NVM) arrays. More specifically, the present invention relates to methods, circuits, devices and/or systems for sensing an NVM cell.

BACKGROUND

Integrated circuits (IC) may be used in a wide range of designs and products, some integrated circuits may include Non Volatile Memory (NVM) arrays. An NVM array may be composed of NVM cells, ancillary circuitry, controller and additional circuits. The ancillary circuitry which may include for example: array controls, address decoding circuits and sense amplifiers (SA). SAs may be configured to determine a value/level of one or more targeted NVM cell.

Some memory array types may include NVM arrays, floating gate arrays, array of eCT cells, array of MirrorBit cells, charge trapping cells and more.

The NVM cells may be single bit or multi-level storage cells and the cells may be programmable to different states, for example in a single bit configuration the cell may be programmable to either an erased (ERS) or programmed (PRG) stage.

According to some embodiments, the NVM cells may be accessed through wordlines (WLs), bitlines (BLs), select lines (SLs), memory gate (MGs) or otherwise. For each operational mode (Programming of cells, Erasing of cells, Reading of cells etc.) the WLs BLs SLs and/or MGs may be activated accordingly. Which WL, which BL, which SL and which MGs as well as if to operate them at all and to what voltage to supply to them is dependent on the mode (read algorithm, program algorithm, read algorithm and so on) and the selected addresses, the specific technology being used and more. Note, that some arrays may not include SLs, MGs or WLs or otherwise.

Some transistor types which may be used in associated circuitry are Pmos, Nmos, low voltage (LV) Nmos, LV Pmos, high voltage (HV) Nmos and HV Pmos, Zmos, BJT and more. HV transistors/cells may be differentiated from LV transistors/cells by being designed/configured to enable operation in a higher range of voltages across their channel compared to LV cells (for example, between a drain node and a source node of the transistor) and/or across the gate (for example: between their gate and bulk or ground node) and may include a thick oxide region compared to LV devices.

SUMMARY OF THE INVENTION

The present invention includes methods, circuits, devices and systems for sensing an NVM cell. According to some embodiments of the present invention According to some embodiments, a non-volatile memory (NVM) device may include an array of NVM cells segmented into at least a first sector and a second sector and at least one sensing circuit to sense a state of a target NVM cell in the first sector using a reference current generated by summing at least a first and second current, the first current may be from at least a first reference NVM cell of the second sector.

According to some embodiments, the second current may be a digital current source current. The second current may be associated with a mini-array. The second current may be from at least a static reference cell of the second sector. The first reference cell may be a dynamic reference cell which may be intermittently erased and reprogrammed. The first reference cell may be a dynamic reference cell and may be substantially reflective of activity history of a typical NVM of the first sector.

According to some embodiments, an NVM device may include an array of NVM cells segmented into at least a first sector and a second sector and at least one sensing circuit to sense a state of a target NVM cell in the first sector using a reference current of the second sector received from at least a dynamic reference cell, a dynamic reference cell may be intermittently erased and reprogrammed.

According to some embodiments, the reference current may be generated by summing at least two currents. At least two currents may be received from reference NVM cells of the second sector which are connected to a common bit-line and separate word-lines. The dynamic reference cell may be substantially reflective of activity history of a typical NVM of the first sector. At least one of the at least two currents may be received from a reference NVM cells of the second sector which may be a static reference cell programmed to a reference level once. The NVM device may include logic circuitry to alter a state of at least one the reference cells from the group including: dynamic reference cells and/or static reference cells. The logic circuitry may alter a state depending on at least one of: sort criteria of the NVM device, number of cycles the NVM device has undergone, typical NVM cell history and/or stage in life cycle of the NVM device.

According to some embodiments, an electronic device may include: an NVM device to store memory data including: (a) an array of NVM cells segmented into at least a first sector and a second sector and (b) at least one sensing circuit may sense a state of a target NVM cell in the first sector using a reference current generated by summing at least two currents, at least one of the at least two currents may be received from at least one NVM cell of the second sector, one or more core circuitry to carry out an electronic functionality at least partially based on the memory data and a controller to (i) access the NVM device and (ii) obtain the memory data and control the core circuitry.

According to some embodiments, the core circuitry may include at least one of the following circuits: a transceiver, an antenna, a transmitter, a receiver, a GPS module, a touchscreen a CCD array, an accelerometer and/or a speaker and more.

According to some embodiments, a method of operating an NVM array may include: receiving a first current from a targeted NVM cell in a first sector, receiving a second current from at least a dynamic reference NVM cell in a second sector, comparing between the first current and the second current and determining a read level of the target NVM cell.

According to some embodiments, the method may also include summing currents from at least two reference NVM cells in a second sector resulting in the second current. Summing currents may be achieved by connecting the at least two reference NVM cells to a common bit-line. The method may further include intermittently erasing and reprogramming at least one of the dynamic reference NVM cell.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that throughout the specification, discussions utilizing terms such as "processing", "computing", "calculating", "determining", or the like, refer to the action and/or processes of a circuit or similar electronic computing device, that manipulate and/or transform data represented as physical, such as electronic, quantities within the circuits elements into other data similarly represented as physical quantities within the circuit's elements.

The present invention includes methods, circuits, devices and systems for sensing an NVM cell. According to some embodiments, NVM cells may be arranged within an NVM array, which NVM array may be segmented into array sectors, such that NVM cells within neighboring or adjacent sectors of the NVM array may be electrically connectable, through respective BLs, to a common sense amplifier. The common sense amplifier, along with functionally associated control logic and bit line switching circuits, may be configured to sense a state of an NVM cell within one of the NVM sectors (which may be termed a targeted sector) using a reference current generated by at least one or more NVM cells within the adjacent sector of the NVM array. The role of each sector (targeted or reference) may switch based on which NVM cell is selected/targeted to be read and/or the read address. The reference current may be received from a single reference source or summed by two or more reference current sources. At least one of the reference current sources may be from an NVM cell also referred to as a reference cell. Additional reference current sources may be received from an additional reference cell which may be embedded in the core array or from a mini-array and/or a digital current source (DCS). Example of DCSs may include a current mirror, a constant current source and/or a resistor and more.

According to some embodiments, a reference cell may have a substantially identical structure to an NVM cell whose state is being sensed. The NVM cell for generating a reference current may be statically programmed to a reference state. The NVM cell for generating a reference current may be dynamically programmed to a reference state.

According to further embodiments the sense amplifier, along with functionally associated control logic and bit line switching circuits, may be configured to concurrently utilize some combination of output currents from two or more separate reference cells as a reference current for sensing the state of a target NVM cell, wherein the two or more separate reference cells may include some combination of statically and dynamically programmed NVM cells. According to yet further embodiments, the static reference cell may be replaced with a static reference cell of a mini-array or a DOS.

According to yet further embodiments, a sector may include multiple sets of NVM cells utilized as reference cells, and functionally associated control logic may select one of the sets within the sector to sense a specific target NVM cell in a neighboring sector based on a relative position of the NVM cell within the neighboring sector.

According to some embodiments, there may be provided an NVM device including an NVM array, one or more bit line switching circuits, power supply circuits, current sensing circuits, and control logic adapted to sense the logical state of a target NVM cell in a target sector of the NVM array by causing: (1) one of the bit line switching circuits to connect an output bit line of the target NVM cell to a first port of a current sensing circuit; (2) one of the bit line switching circuits to connect an output bit line to one or more current sources providing the reference current from a neighboring sector; and (3) causing the power supply circuits to apply operational voltages to the target and reference cells. The second reference input provided to the second port of the sense amplifier may be generated by and received from a combination of two or more reference cells operated concurrently, wherein the two or more reference cells may be connected to a common bit line while having separate WLs.

According to some embodiments, two or more reference cells may be substantially integrated in a regular NVM sector and each may have one or more dedicated WLs to control them. A reference cell may be a dynamic reference cell and may be intermittently erased and reprogrammed substantially similarly to the target sector and/or a sub-sector within the target sector (such as an E-sector) so that it mirrors/represents/emulates a typical NVM cell of the target sector and/or is representative of the history of a typical NVM cell of the target sector. Furthermore, since the reference cell may be embedded in a regular array sector, the interferences, operation and forces acting on the cell may be substantially similar to a regular NVM cell of the target sector. A static reference cell may be a reference cell whose programmed state remains substantially fixed during its operational lifetime, or is not cycled concurrently with a group of data NVM cells. For example, a static reference cell may be programmed at limited predetermined instances/ times (for example: once at the beginning of operation, beginning of life or at sort of a device and more). One or more static reference cells may be included in a static reference sub-sector controllable via one or more static WLs and one or more dynamic reference may be included in a dynamic array sub-sector controlled by one or more dynamic WLs.

The reference input may be received from a hybrid reference configuration, wherein the hybrid configuration may include at least one dynamic reference cell and least one static reference input (from an embedded static reference cell, from a mini-array and/or from a DCS). Respective output current from a set of reference cells used as part of a hybrid combination may vary over time and optionally in response to operating conditions. According to some embodiments, in a hybrid reference configuration, a hybrid algorithm may be operable so that the reference cells may be controlled/programmed so that the order/effect of the at least one static reference and the at least one dynamic reference is controllable. For example, if a targeted NVM cell is expected to produce/emit/provide 8 uA, a dynamic reference cell and a static reference current may each be programmed to a targeted 3 uA (for a total of 6 uA), or the dynamic reference may be targeted to 2 uA and the static reference current to 4 uA or vice versa. In this example, the effect of the dynamic and reference cells may be substantially controlled. It is understood that the targeted reference current (or threshold voltage) may be reprogrammed/changed/controlled as a function of: sort criteria of the NVM device, number of cycles the NVM device has undergone and/or stage in life cycle of the NVM device, NVM cell history and more. It is understood that the aforementioned examples discuss target current levels but may be applicable to targeted threshold voltages. It is further understood that the dynamic reference cell's current/threshold voltage may transition during operation of the NVM device so that the example values above are an expected value at initial programming but that these targets are subject to transition. Furthermore, in such an example the static reference cell may be reprogrammed one or more times depending on the target reference algorithm.

According to some embodiments, the sense amplifier may be a local sense amplifier so that the reference BL and the targeted NVM cell BL may be substantially similar and may further aid in/enable a very fast read determination (for example 3-7 nS, but not limited to this example).

According to some embodiments, the static reference supply may be connected to the reference BL or may run through a load emulating/substantially equal to an average BL. The reference supply running through the reference BL contributes to an increased matching between the reference input and the targeted cell further allowing a fast read cycle, or a more accurate read output.

Figure 1:
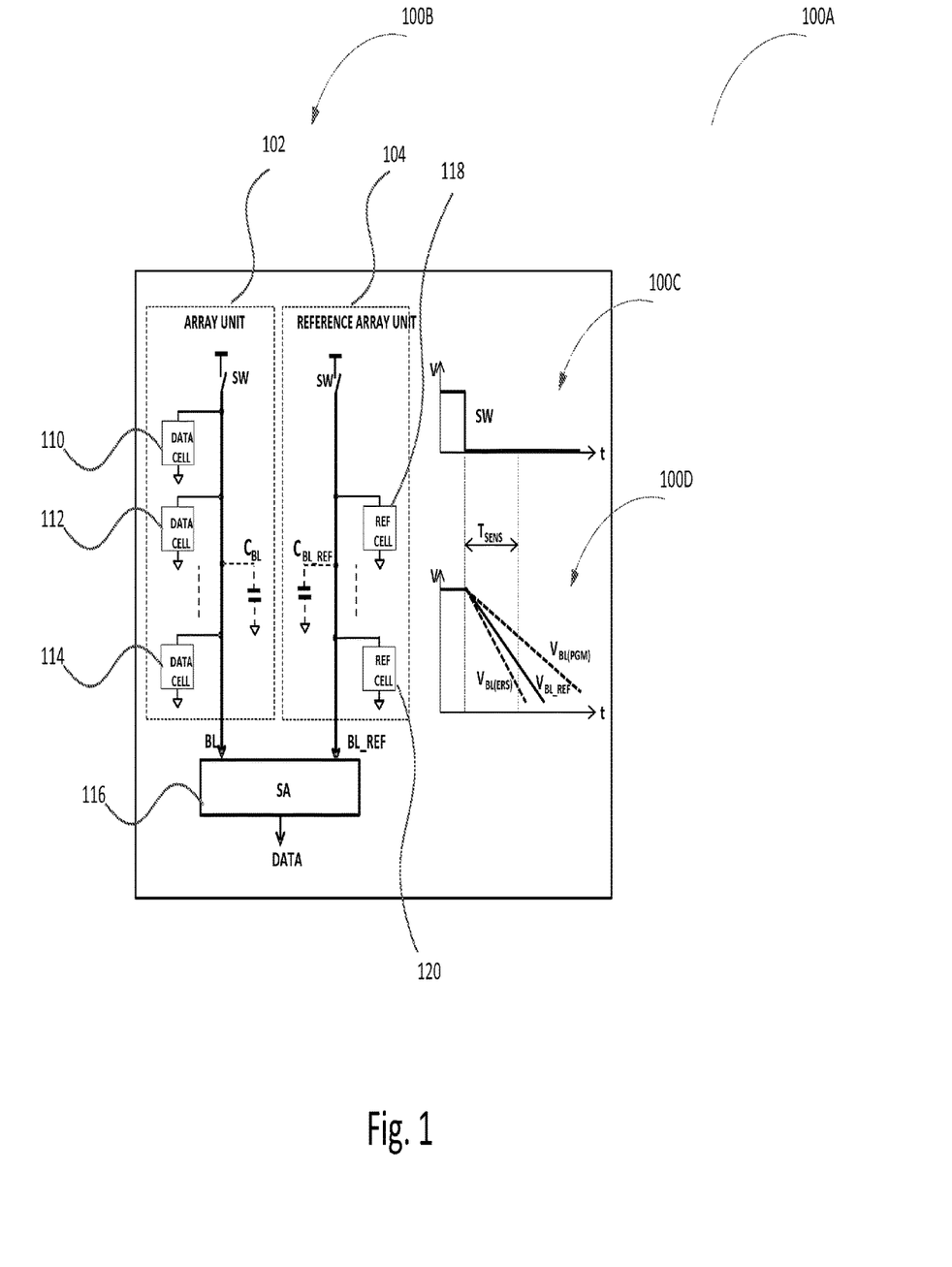
FIG. 1 is a demonstrative block level comparison between an example array unit and a reference array unit and associated graphs in accordance with embodiments of the present invention.

Turning to FIG. 1, depicted is a demonstrative block level schematic 100A of a fast access memory structure 100B and associated graphs (100C and 100D) in accordance with some embodiments of the present invention. Fast access memory structure 100B may include array unit 102 and reference array unit 104 including pre-charge switches (SW) and a fast sense amplifier SA 116. Along the BL of array unit 102 there are one or more data cells which may be targeted during a read operation such as data cells 110, 112 and 114 and along BL_REF of reference array unit 104 there is one or more reference cells which may be activated such as REF-CELL 118 and 120. The BL capacitance stemming from each of the lines (BL and BL_REF) and additional parasitic loads on these lines are shown by $C_{BL}$ and $C_{BL\_REF}$ capacitors (respectively).

According to some embodiments, a fast sensing operation may be executed by discharging a previously charged BL and BL_REF by selecting a Data Cell (110, 112 or 114) from Array Unit and at least one reference cell (ref cell 118 and/or 120). SA 116 may compare the current/voltage/input received from the BL to the input received from the BL_REF and determine a read value. As depicted by graph 100C and 100D, both BL and BL_REF are charged to an initial voltage, then when the pre-charge switch SW is disconnected/opened, the current from the Data cell and the reference cell cause the BL and BL_REF to discharge (respectively). Depending on the state of the selected data cell: erase (ERS) or programmed (PGM) the voltage sensed at the BL entrance to the SA 116 may either be higher or lower than the BL_REF voltage input and after Tsense time the DATA output may indicate the state of the sensed data cell.

Extremely fast sensing (for example Tsense=3-5 nS) may be achieved if bit line capacitance is very small (for example tens fentoFarad), but it may cause a raised/heightened importance of BL and BL_REF RC (load stemming from capacitance and resistance) matching. It is understood that even a small mismatch between the data cell path (i.e. BL, CBL and load on the line) and Reference path (i.e. BL_REF, CBL_REF and load on the line in this example) may induce/cause a sensing result error or may necessitate a longer read cycle, or larger margins between cell and reference threshold voltages or otherwise.

As will be discussed with regard to FIG. 4 cycling and retention may decrease Erase and Program margins. Accordingly, adaptive/dynamic reference cells which may behave as cycled Data cells may significantly improve Erase and Program margin. It is understood that a fast and accurate sensing operation may require significant matching between the data cell path and the reference path.

Additional sensing schemes not shown with regard to FIG. 1 are operable with conjunction to the embodiments described in the following figures including source side sensing, or additional drain side sensing flows and more.

Figure 2A:
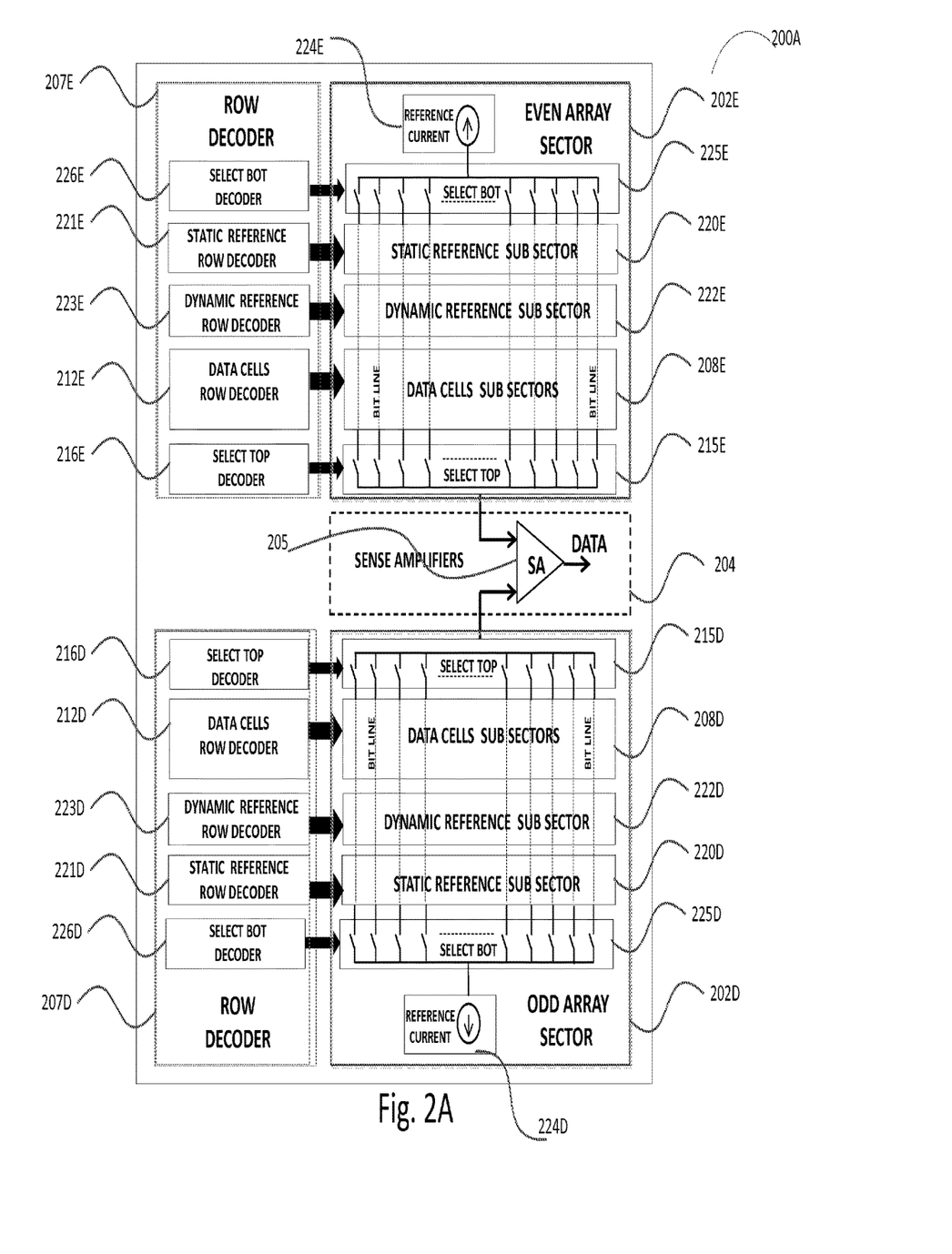
FIGS. 2A and 2B each depicts block level array sectors including sense amplifiers and peripheral circuitry in accordance with embodiments of the present invention.

Turning to FIG. 2A, depicted is a block level NVM array 200A including sectors such as even array sector 202E and odd array sector 202D, common sense amplifiers 204 including one or more joint/common sense amplifiers such as sense amplifier 205 and peripheral circuitry such as row decoders 207D and 207E in accordance with some embodiments of the present invention.

According to some embodiments, even array sector 202E may include data cell sub sector 208E. The NVM cells within data cell sub sector 208E may be electrically connectable through respective bit lines (shown) to sense amplifiers within sense amplifier block 204. Although one data cell sub sector is depicted with regard to even array sector 202E, it is understood that data cell sub sectors 208E may be split up/partitioned into multiple sub sectors such as per erase sector (E-sector) or otherwise. An E-sector may be a group of one or more WLs and/or SLs operated simultaneously to carry out substantially concurrent erasure of one or more NVM cells connected to that group of WLs.

According to some embodiments, while two array sectors within NVM array 200A are depicted (odd and even array sectors 202D and 202E) it is understood that NVM array 200A may include 2 or more array sectors, wherein the additional sectors are in a configuration similar to odd and even array sectors 202D and 202 E and sense amplifier block 204.

Odd and even array sectors 202D and 202E may be adjacent, neighboring, above and below each other, in a checkerboard configuration may be separated by one or more additional sectors or otherwise. Sense amplifier block 204 may be between or near even and odd array sectors 202E and 202D.

According to some embodiments, data cell sub sector 208E may include non-volatile memory (NVM) cells each configured to store one or more bits.

According to some embodiments, WL activation for data cells subs sector 208E may be controlled by peripheral circuits such as data cells row decoder 212E. BL activation such as which BL to connect to one of the SAs via select top switches 215E may be determined by select top decoder 216E. MG selection and/or enablement may also be controlled by data cells row decoder 212E.

According to some embodiments, even array sector 202E may include one or more reference sub sectors such as static reference sub sector 220E and dynamic reference sub sector 222E, both of which may each include NVM cells for generating a reference current and these cells may also be referred to as reference cells. The reference cells may have substantially the same/identical structure to the NVM cells of the data cells and may be connected to the same group of bitlines as the NVM cells of data cells sub sector 208E. WL activation of static reference sub sector 220E may be operated/controlled activated by static reference row decoder 221E. WL activation for dynamic reference sub sector 222E may be operated/controlled by dynamic reference row decoder 223E.

According to some embodiments, one or more of the BLs associated with the NVM cells of data cells sub sector 208E may also connect to at least some of the reference cells of static reference subs sector 220E and dynamic reference sub sector 222E and the NVM cells of all three sectors may be integrated in one array sector.

Even array sector 202E may further include one or more additional reference current sources such as reference current source 224E. Enablement and control of the BLs to receive the additional current may be controlled by select bot decoder 226E configured to enable connection of one or more current sources such as current source 224E to one or more BLs via/through select bot 225E.

It is understood that even array sector 202E and odd array sector 202D are substantially similar and that elements/blocks/segments 208E-226E are substantially similar to elements/blocks/segments 208D-226D appropriately.

According to some embodiments, the reference cells of dynamic reference sub sector 222E, static reference sub sector 220E and/or reference current 224E may be operationally associated with the NVM cells of Data cells sub sector 208D of odd array sector 202D.

According to some embodiments, SA 205 may be configured to sense/determine a state of an NVM cell within NVM data cell sub sectors 208E or 208D using a reference current generated by at least one or more NVM cells and reference current from/within the adjacent sector of the NVM array. The role of each sector (targeted or reference) may be switched based on which NVM cell is selected/targeted to be read and/or the read address. Accordingly, when the targeted NVM cell is in NVM data cell sub sector 208E, SA 205 may receive the reference current from odd array sector 202D and when the targeted cell is in NVM data cell sub sector 208D the reference current may be received from even array sector 202E.

According to some embodiments, the reference cells may be utilized in comparison to a targeted NVM cell to determine the targeted cell's value/state. Reference cells may be programmed to a specific current inside the window between '1' which may be considered an 'Erase' state and '0' which may be considered a programmed state (Erase and program definitions are arbitrary and can be switched/interchangeable). For MLC there may be two or more different program states.

According to some embodiments, the reference NVM cells of static reference sub sector 220D may be statically programmed to a reference state and may be termed static reference cells. Statically programming a reference cell may include programming a reference cell once to a predetermined level or at a limited amount of times at predetermined times/situation. A static reference cell may be a reference cell whose programmed state remains substantially fixed during the operational lifetime of an NVM cell. A static reference cell may also be a reference cell that is not cycled according to the programming and/or erase cycles of the data cells in the same sector or an associated sector, for example a static reference cell of 220D may not be cycled concurrently with/according to programming and/or erasing cycles of NVM cells of data sub sector 208E or 208D.

According to some embodiments, a static reference current/reference cell may be programmed or re-programmed, or a state of the static reference cell/reference current may be altered based on one or more of the following parameters: sort criteria of the specific NVM device which may be typically determined during a sort period after production, number of cycles (for example number of times that even array sector 202E has been programmed and/or erased), typical NVM cell history, stage in life cycle of the NVM device (for example, how many times the device has been cycled or how long the device has been in operation). Some examples may include: a static reference cell that is programmed only once at the beginning of the device operation, or programmed only once in a sort process, a static reference cell that is programmed 1-100 times throughout the life of the product or 1-1000 times for example for a product configured to be cycled for up to 1 million cycles.

According to some embodiments, a targeted NVM cell may be comparable to one or more selectable static cells for example, in MLC devices there may be several references or separate static references may be used depending on the sub-sector in which the targeted cell resides or otherwise.

According to some embodiments, a first type of reference current may be received from an embedded static reference cell of static reference sub sector 220D. The NVM cell emitting the reference current may be substantially similar to an NVM cell of data cell sub sector 208E. There may be dedicated WLs and/or SLs operated/activated by static reference decoder 221D. One or more static reference cells may share a WL and/or SL. Accordingly static reference sub sector 2200 may include one more static reference cells, operated by one or more WLs and/or SLs controlled by static reference row decoder 221D.

According to some embodiments, a second type of reference current may be a reference current received from a digital current source such as reference current 224D. Some examples of reference current sources may include a current mirror branch connected to the BL path, or a proximate mini array similar to static reference static reference sub sector 2200 but not embedded within odd array sector 202D so that the mini array may be shared for several odd array sectors. The DCS current source such as reference current 224D may be configured to connect to the BL so that the reference current flows through the BL to substantially match the current path of the targeted cell within data cell sub sector 208E.

According to some embodiments a static reference current may be received either from an embedded static reference cell from static reference sub sector 202D or from reference current 2240 or from a combination of the two static reference currents. Some embodiments including only one of the types of static sources or without static reference sources are also understood.

According to some embodiments, a reference cell may be a dynamic reference cell from dynamic reference sub sector 222D. The dynamic reference cell may be dynamically programmed to a reference state/level. Accordingly, a dynamic reference cell may be intermittently erased and reprogrammed.

According to some embodiments, a dynamic reference cell embedded in dynamic reference sub sector 222D may be programmed to an initial state/level and may be intermittently erased and reprogrammed substantially similarly to a the reference cell of data cells sub sector 208E. Furthermore, since dynamic reference cells are embedded with odd array sector 202D, some of the interferences and forces acting on the cell may be substantially similar to a typical NVM cell.

According to some embodiments, a dynamic reference cell within dynamic reference sub sector 222D may be cycled substantially similarly to an NVM cell of the data cells sub sector 208E so that the dynamic reference cell mirrors/represents/emulates a typical NVM cell of data cell sub sector 208E (or in other words, it mirrors a typical NVM cell of the target sector) and may be representative of the history of a typical NVM cell of the target sector.

According to some embodiments, a state of a dynamic reference cell of dynamic reference sub sector 222D may be altered based on cycling or activity history of the neighboring sector and may be further altered based on/depending on one or more of the following parameters: sort criteria of the NVM device, number of cycles the NVM device has undergone (or a section of the NVM device), typical NVM cell history, stage in life cycle of the NVM device.

According to some embodiments, one or more dynamic reference cells may share a WL and or SL, and one or more dynamic reference may be included in dynamic reference sub sector 222D controlled by one or more WLs and/or SL and operated by dynamic reference row decoder 223D.

According to some embodiments, if data cell sub sector 208E includes several sub sectors for example, several E-sectors then dynamic reference row decoder 223D may control several WLs of dynamic reference sub sector 222D so that each group of one or more reference cells on each dynamic WL may be cycled separately and emulate the history of each E-sector. Furthermore, one or more reference cells on a WL may be used for an MLC configuration and/or if there are multiple programming levels.

According to some embodiments, a reference current received from odd array sector 202D to be compared at SA 205 with the target current of a target NVM cell of even array sector 202E may be received from: (a) at least one dynamic reference cell or (b) at least two references with a shared BL.

According to some embodiments, the respective output current from a set of reference cells used as part of a hybrid combination may vary over time and optionally in response to operational conditions. A hybrid combination may include a summed combination of at least one static reference source and at least one dynamic reference cell.

Figure 5A:
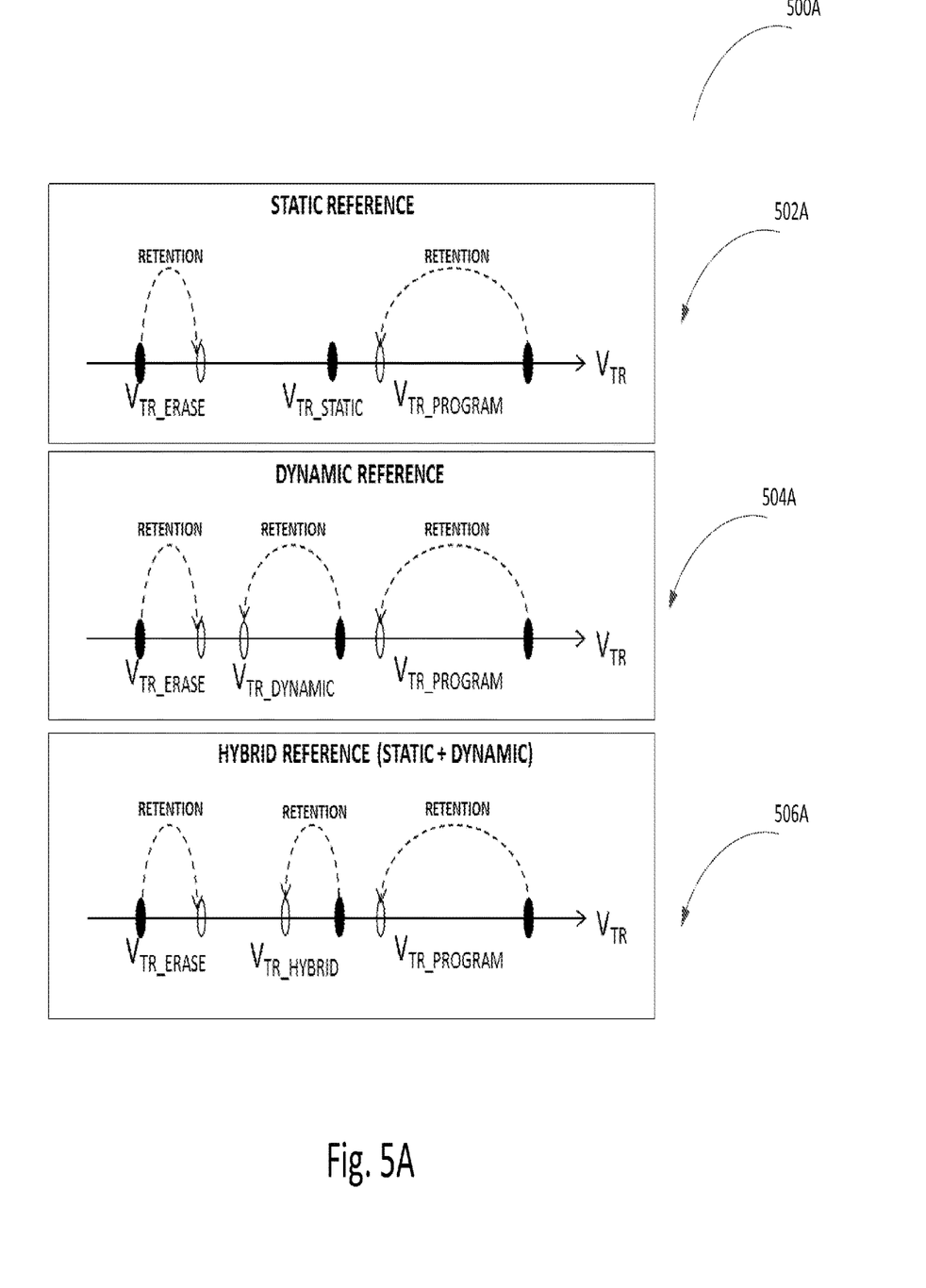
FIGS. 5A and 5B depict graphical diagrams of different reference cell threshold voltages behaviors in accordance with some embodiments of the present invention.

Turning to FIG. 5A, depicted is a graphical diagram 500A of different reference cell threshold voltages behaviors in accordance with some embodiments of the present invention. Behavior/shift or drift of the threshold voltages of different reference cells due to retention or the like are shown over the life of a device with an array as discussed with regard to FIG. 2. It is understood that although a threshold voltage is discussed the threshold voltage is also associated with the reference current discussed. All of the charts 502A, 504A and 506A depict behavior of a reference cell the threshold voltage, of an erased cell ($V_{TR\_ERASE}$) and of a programmed shift programmed cell ($V_{TR\_PROGRAM}$) over operation of a device. The shift is shown with a dotted arrow showing the change for the initial black oval to a white oval (where applicable).

Chart 502A shows an example static reference, it is evident that the static threshold voltage of the static reference remains the same while both $V_{TR\_PROGRAM}$ and $V_{TR\_ERASE}$ migrate towards $V_{TR\_STATIC}$. It is understood that the farther $V_{TR\_PROGRAM}$ and $V_{TR\_ERASE}$ are from the reference threshold voltage the lower the likelihood that an error in detecting a state of a targeted NVM cell and/or the larger the read margin which may be traded off for sensing time and/or accuracy/matching of inputs to SA 205 of FIG. 2. An example Dynamic reference is shown with regard to chart 504A, in this example, it is evident that $V_{TR\_ERASE}$ and $V_{TR\_DYNAMIC}$ may migrate toward each other, while the margin between $V_{TR\_DYNAMIC}$ and $V_{TR\_PROGRAM}$ remain relatively distant. A hybrid reference is shown with regard to chart 506A; it is evident that $V_{TR\_ERASE}$ and $V_{TR\_DYNAMIC}$ of chart 504A migrate toward each other, while the margin between $V_{TR\_HYBRID}$ remains substantially between the two threshold voltages $V_{TR\_PROGRAM}$ and $V_{TR\_ERASE}$.

Figure 5B:
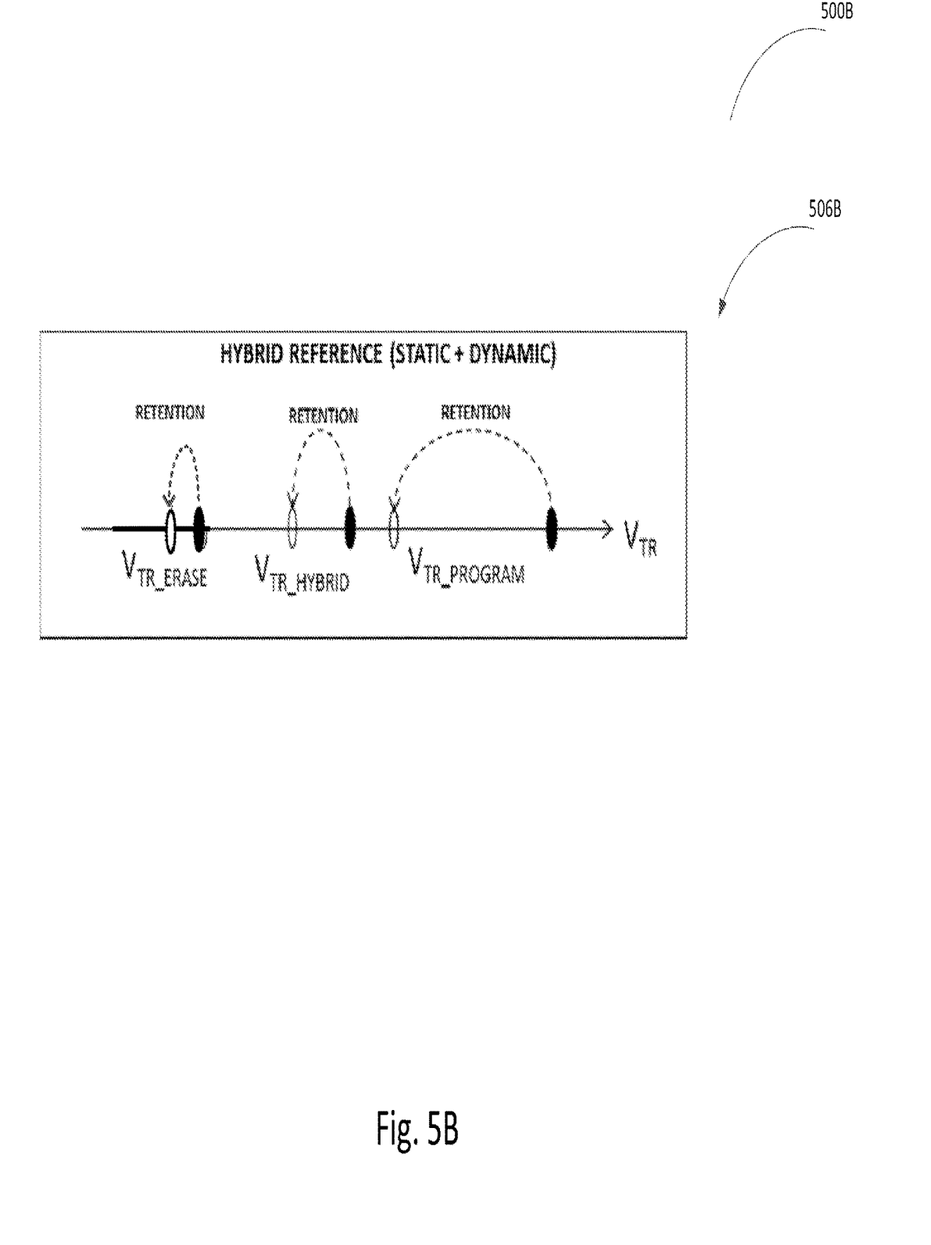

Turning to FIG. 5B, depicted is a graphical diagram 500B of dynamic reference cell threshold voltages behaviors in accordance with some embodiments of the present invention. Behavior/shift or drift of the threshold voltages of different reference cells due to retention or the like are shown over the life of a device with an array as discussed with regard to FIG. 2. Chart 506B is substantially similar to chart 506A as they both depict behavior of a hybrid reference. In the example shown in 506B, movement/retention of $V_{TR\_ERASE}$ may be designed to be in the same direction as $V_{TR\_DYNAMIC}$ (see 504A for example) so that the two follow each other. This configuration may allow $V_{TR\_HYBRID}$ to be relatively close to the $V_{TR\_ERASE}$, thus enlarging the window between $V_{TR\_PROGRAM}$ and $V_{TR\_HYBRID}$ which may enable improving sensing time, improved accuracy and more.

Turning back to FIG. 2A, in a hybrid reference cell configuration where a reference current is received from at least one dynamic reference from dynamic reference sub sector 222D and at least one static reference current is received from at least one static reference current source such as static reference sub sector 220D and/or reference current 2240, the two or more currents may be summed by having a joint BL or otherwise.

According to some embodiments, a hybrid algorithm may be operable so that the dynamic and/or static reference cells may be controlled/programmed so that the order/effect of the at least one static reference and the at least one dynamic reference is controllable, for example to optimize or improve the distance between $V_{TR\_HYBRID}$ and $V_{TR\_PROGRAM}$ and/or the distance between $V_{TR\_HYBRID}$ and $V_{TR\_ERASE}$ of FIG. 5.

According to an example in accordance with some embodiments, in a hybrid configuration, if a targeted NVM cell of data cell sub sector 208E is expected to produce/emit/provide 8 uA when in an erased state, a dynamic and a static reference cell of dynamic reference sector 222D and static reference sector 220D (respectively) may be programmed to a targeted 3 uA (for a total of 6 uA). In another example, the dynamic reference may be targeted to 2 uA and the static reference may be targeted to 4 uA. In yet a further example the dynamic reference may be targeted to 4 uA and the static reference may be targeted to 2 uA.

According to some embodiments, the effect and/or magnitude of the dynamic and static reference cells may be substantially controlled. It is further understood that the targeted reference current (or the targeted threshold voltage) may be reprogrammed/changed controlled as a function of one or more of the following parameters: sort criteria of the NVM array 200A, number of cycles that the NVM array 200A has undergone and/or stage in life cycle of the NVM device, NVM cell history of a data cell of data cells sub sector 208E and more. Furthermore, the dynamic reference cell's current/threshold voltage may transition during operation of the NVM device so that the example values discussed above relate to an initial programming but these targets are subject to transition due to cycling of one or more dynamic reference cells. Furthermore, the static reference cell may also be reprogrammed one or more time depending on the target reference algorithm and/or the dynamic algorithm.

According to some embodiments, the adjustable dependency of the hybrid reference current on cycling, retention and temperature may improve reliability and endurance of NVM array 200A.

Figure 2B:
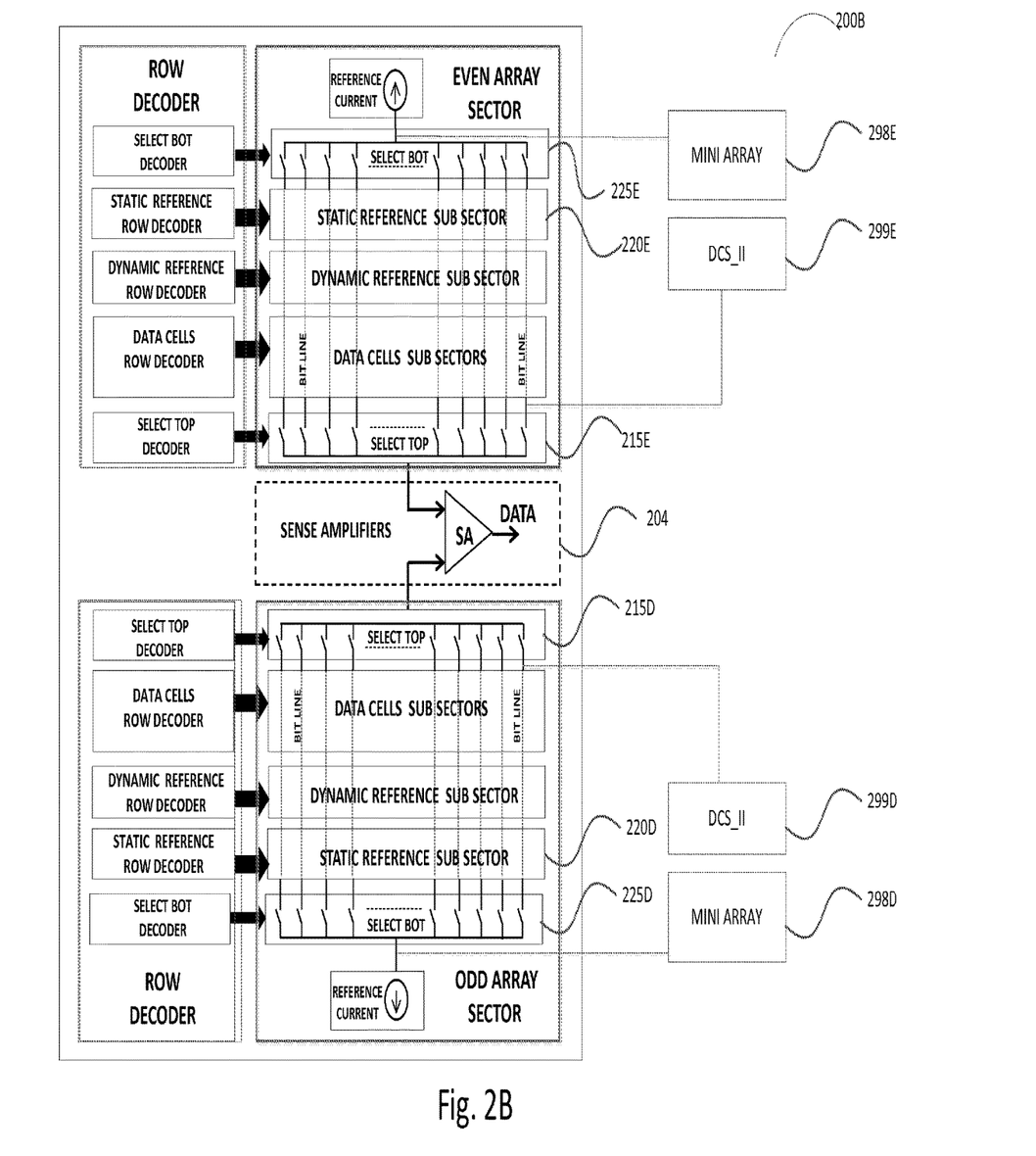

Turning to FIG. 2B, it is understood that NVM array 200B is substantially similar to NVM array 200A. NVM array 200B may further include mini-arrays 298E and 298D to provide a DCS current via select bot 225E and 225D respectively. NVM array 200B may further include additional DOS current sources such as DCS_II 299E and 299D which may be connected via select_top 215E and 215D respectively. Although, in a preferred embodiments, DOS sources may be connected via select_bot 225E or 225D so that the current runs through the bitline to increase matching at sense amplifiers 204, it is understood that in some configurations a reference current may at least partially be received through select_top 215D or 215E, in which case either a bitline may be connected to add load to the reference current or a pseudo bitline with resistance and capacitance similar to a bitline or otherwise. DCS_II 299D and 299E are understood to be substantially similar and may be any digital current source examples of which have already been discussed above. A mini-array may be a block or segment similar to static reference sub sector 220D or 220E.

Figure 3:
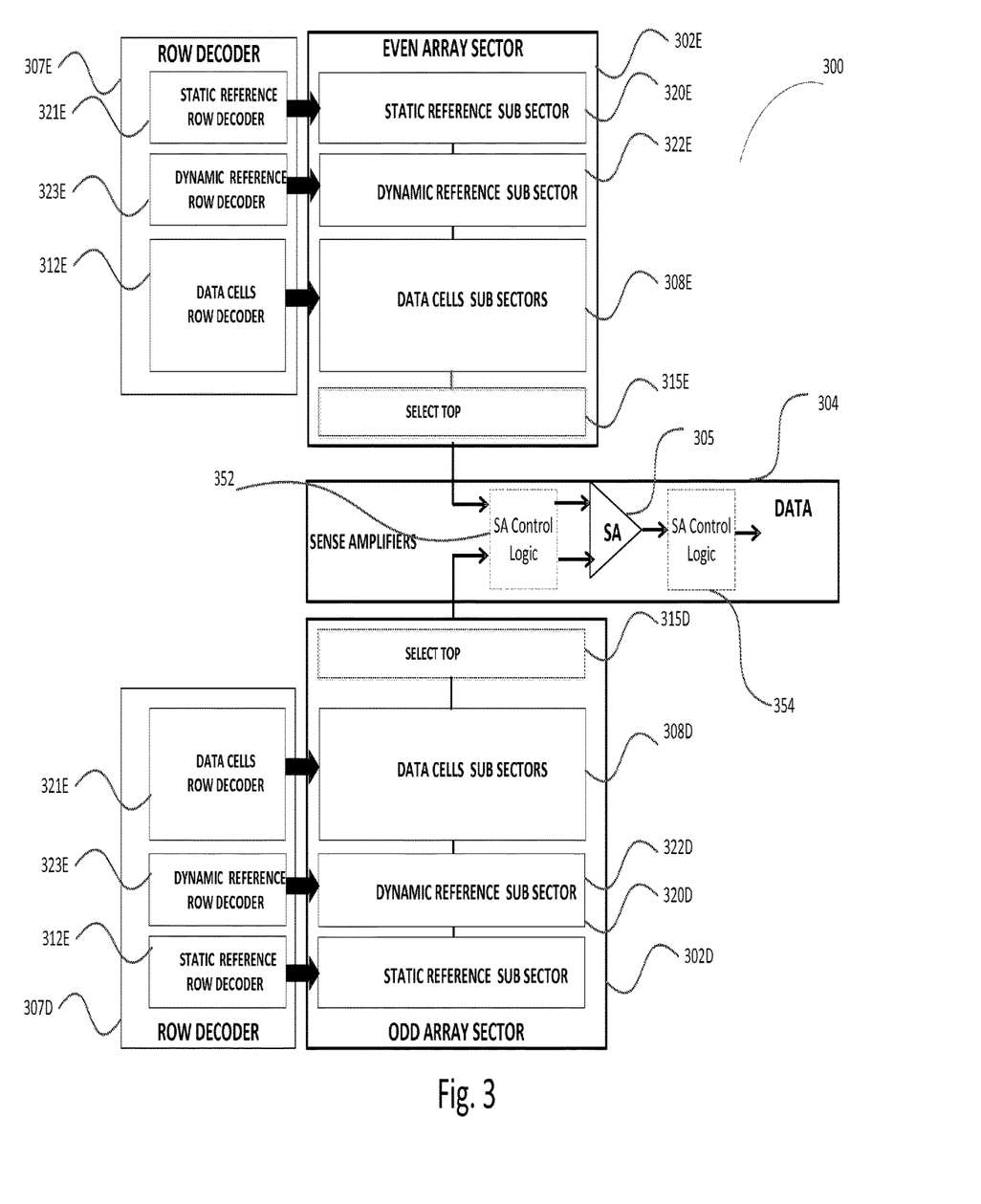
FIG. 3 depicts block level array sectors including sense amplifiers and peripheral circuitry in accordance with embodiments of the present invention.

Turning to FIG. 3, depicted is a block level array 300 including two or more sectors including sense amplifiers and peripheral circuitry in accordance with embodiments of the present invention. It is understood that elements/blocks/circuits 302E-323E and 302D-323D are substantially similar to elements 202E-223E and 202D-223D of FIG. 2A discussed above. In some embodiments, one or more static references may be embedded static references within static reference sub sector 320E, for example. In the example embodiments described below a DCS is not discussed and so is not depicted, although discussion of the following embodiments may be applicable to the embodiments of FIG. 2 some of which may include a DCS.

According to some embodiments, array 300 may include one or more sense amplifiers in a sense amplifier block 304 including sense amplifier (SA) 305. SA 305 may be configured to determine a result in a read operation. An example read operation may be executed in parallel for one or more targeted cells each optionally read according to the following example: SA 305 may compare a targeted array cell current/voltage to a reference current/voltage. The targeted current may be received from a data cell which may be selected from an array sector such as data cell sub sector 308D of odd array sector 302D. The reference current may be obtained from even array sector 302E, by summing at least two reference cells at least one of them from dynamic reference sub sector 322E, all of the reference cells contributing to the reference current compared with the targeted current may have a joint BL and may have several WLs controlling/enabling them, According to some embodiments, sense amplifier 305 may be a local sense amplifier; the reference BL and the targeted NVM cell BL may be substantially similar and may further aid in/enable a very fast read determination. Substantially full RC matching between the data path and reference cell path may allow very high speed read operation.

According to some embodiments, SA 305 may be a comparator. In some configurations associated with the invention because the roles of the sectors may be switched, i.e. the ref current can come from even sector array 302E for sensing odd array sector 302D or the ref current can come from odd array sector 302D for sensing even sector 302E, there may be dedicated logic associated with SA 305 which depends on the odd/even role, to aid/help/assist the SA in determining how to decipher the output, or how to connect the input such as optional SA control logic 352 and/or 354 which may be before or after the SA 305 respectively. The control logic may include different configurations such as: only before SA 305, only after SA 305 or a combination of the two or neither. For example SA control logic 352 may be utilized to ensure that the reference input is always routed to the same SA pin by using the knowledge of the address of the target cell (even/odd) and using some additional multiplexing circuitry. In another example, SA control logic 354 may selectively alter the output based on the address, for example a XOR function on the output and address information.

Figure 4:
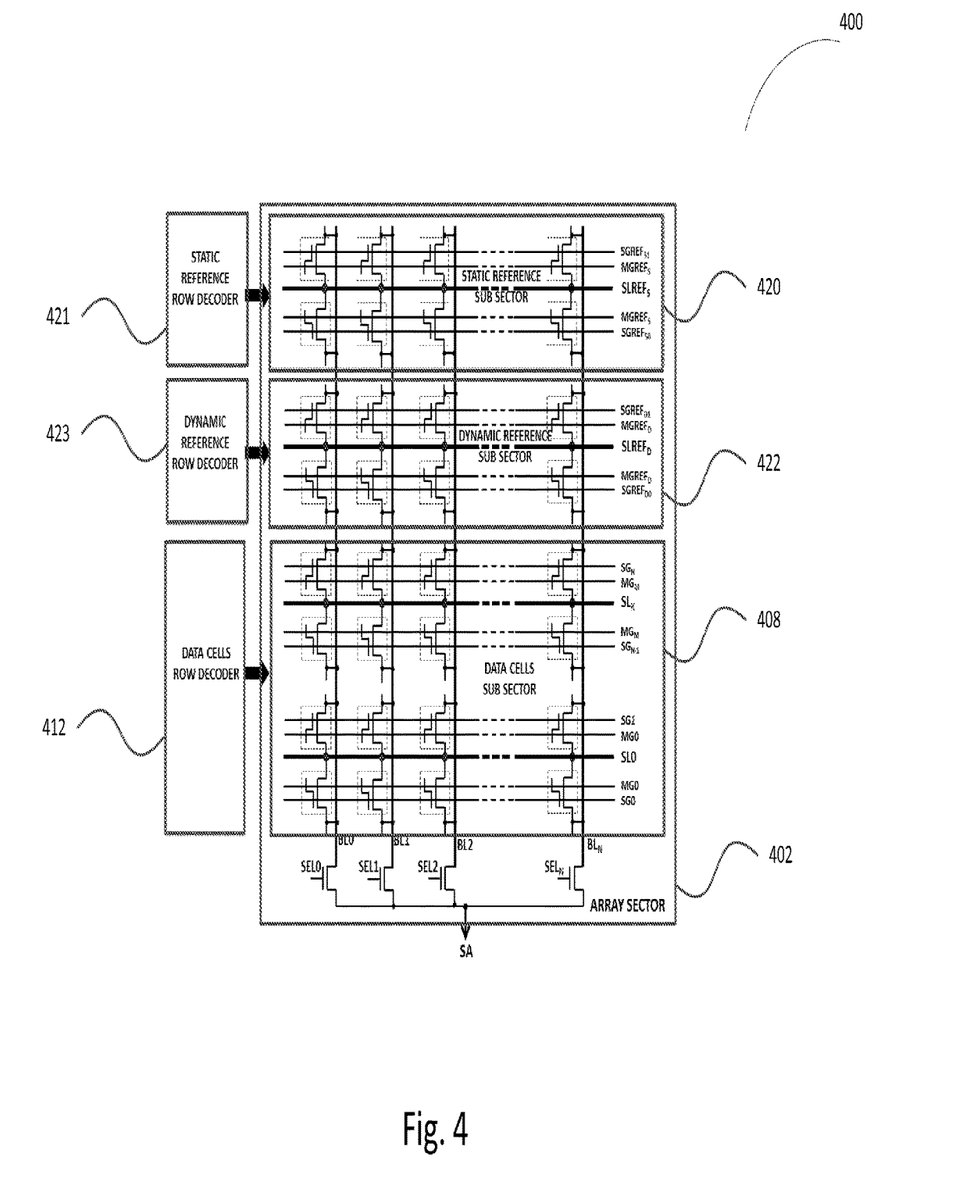
FIG. 4 depicts an example circuit level array sector in accordance with embodiments of the present invention.

Turning to FIG. 4, depicted is an example circuit level array sector 400 in accordance with some embodiments. It is understood that array sector 402, data cells sub sector 408, dynamic reference sub sector 422, static reference sub sector 420, data cells row decoder 412, static reference row decoder 421 and dynamic reference row decoder 423 are substantially similar to array sector 302E, data cells sub sector 308E, dynamic reference sub sector 322E, static reference sub sector 320E, data cells row decoder 312E, static reference row decoder 321E and dynamic reference row decoder 323E.

Figure 6:
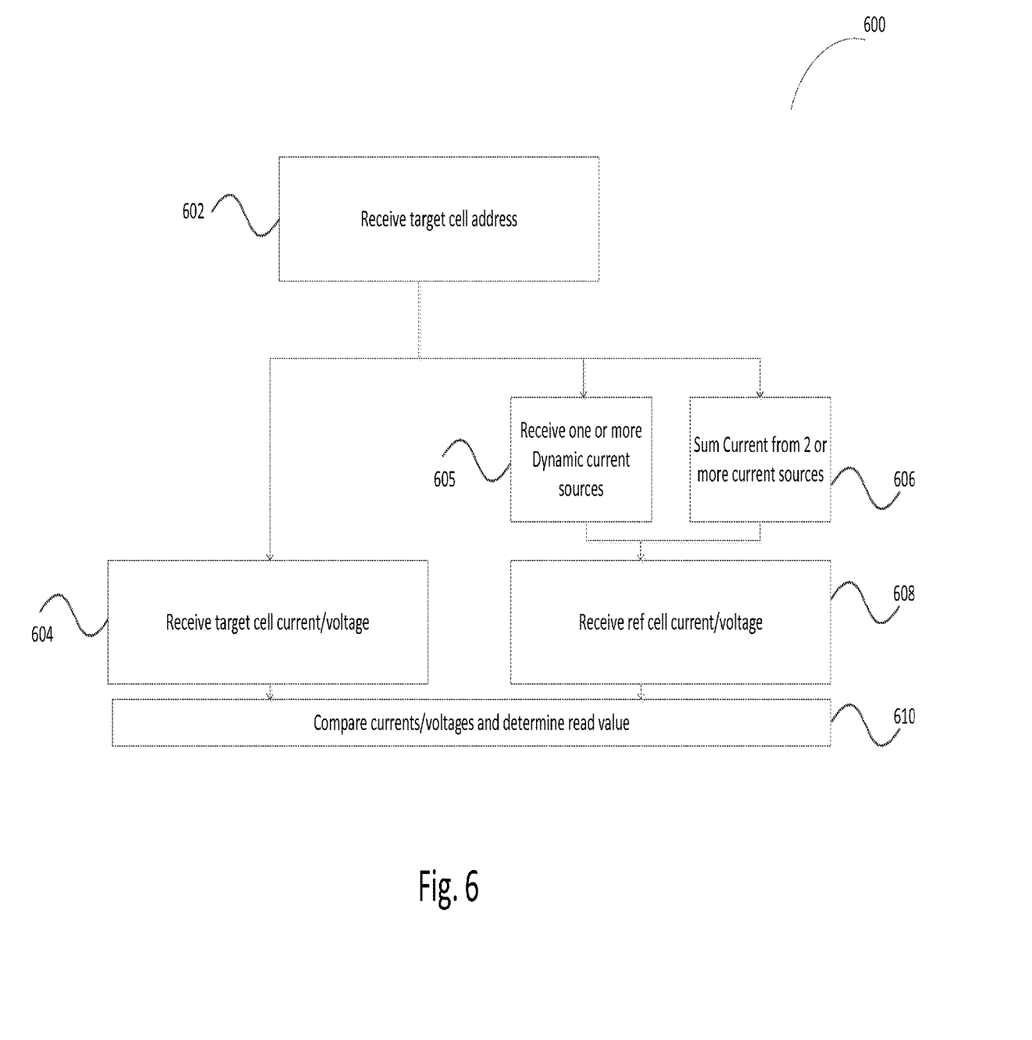
FIG. 6 is a flow chart of an example method for reading an NVM cell in accordance with some embodiments of the present invention.

Turning to FIG. 6, shown is a flow chart 600 of an example method for reading an NVM cell in accordance with some embodiments. A target cell address may be received (step 602) following which a target cell current or voltage may be received from a first array sector (step 604) and either receive a dynamic reference current (605) or sum 2 or more reference currents from a second, associated, array sector (step 606). A reference cell current/voltage may be received (step 608), the two currents/voltages (reference and targeted) may be compared and a read value may be determined (step 610).

According to some embodiments, the summed reference current of step 606 may be received from at least one dynamic reference cell combined with: (a) an additional dynamic reference cell; (b) a static embedded reference cell; (c) a static reference current from a DCS and/or a combination of one or more of these reference cells/currents or otherwise.

Figure 7:
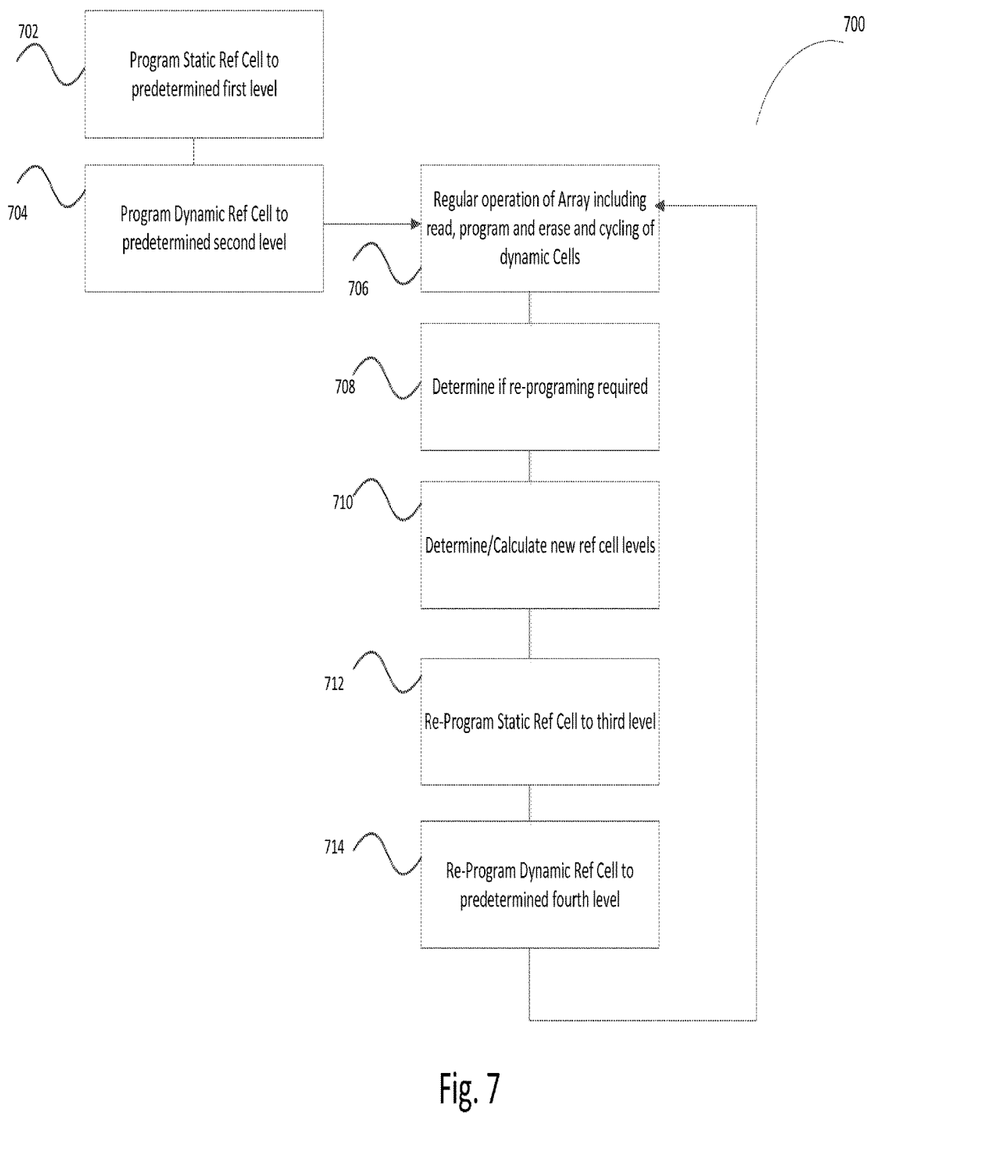
FIG. 7 is a flow chart of an example method for programming a reference cell utilizing a Hybrid Algorithm in accordance with some embodiments of the present invention.

Turning to FIG. 7 shown is a flow chart 700 of an example hybrid method for operating an NVM array in accordance with some embodiments. A static reference cell may be programmed to a predetermined level/state (step 702), a dynamic reference cell may be programmed to a predetermined level/state or the reference cell may be sustained in a native state (step 704). The array may then be operated in the array's regular mode of operation such as reading, programming, erasing of target NVM cells as well as cycling of dynamic cells (step 706). It is noted that the dynamic cells of an odd sector are cycled in concert with/similarly to the programming and/or erasing of memory cells of the associated even sector and vice versa. A native state of an NVM cell may be a non-programmed state, where the threshold voltage is at its produced state.

According to some embodiments, a micro controller or other logic circuitry may determine that reprogramming of one or more of the reference cells or reference currents is required (step 708) and the value to which each of the reference cells and/or reference cell types (static, dynamic, different PGM levels for MLC etc.) may be determined (step 710). The dynamic and/or static ref cell and/or reference currents may then be reprogrammed (step 712 and 714) and the memory array may return to normal operation.

Figure 8:
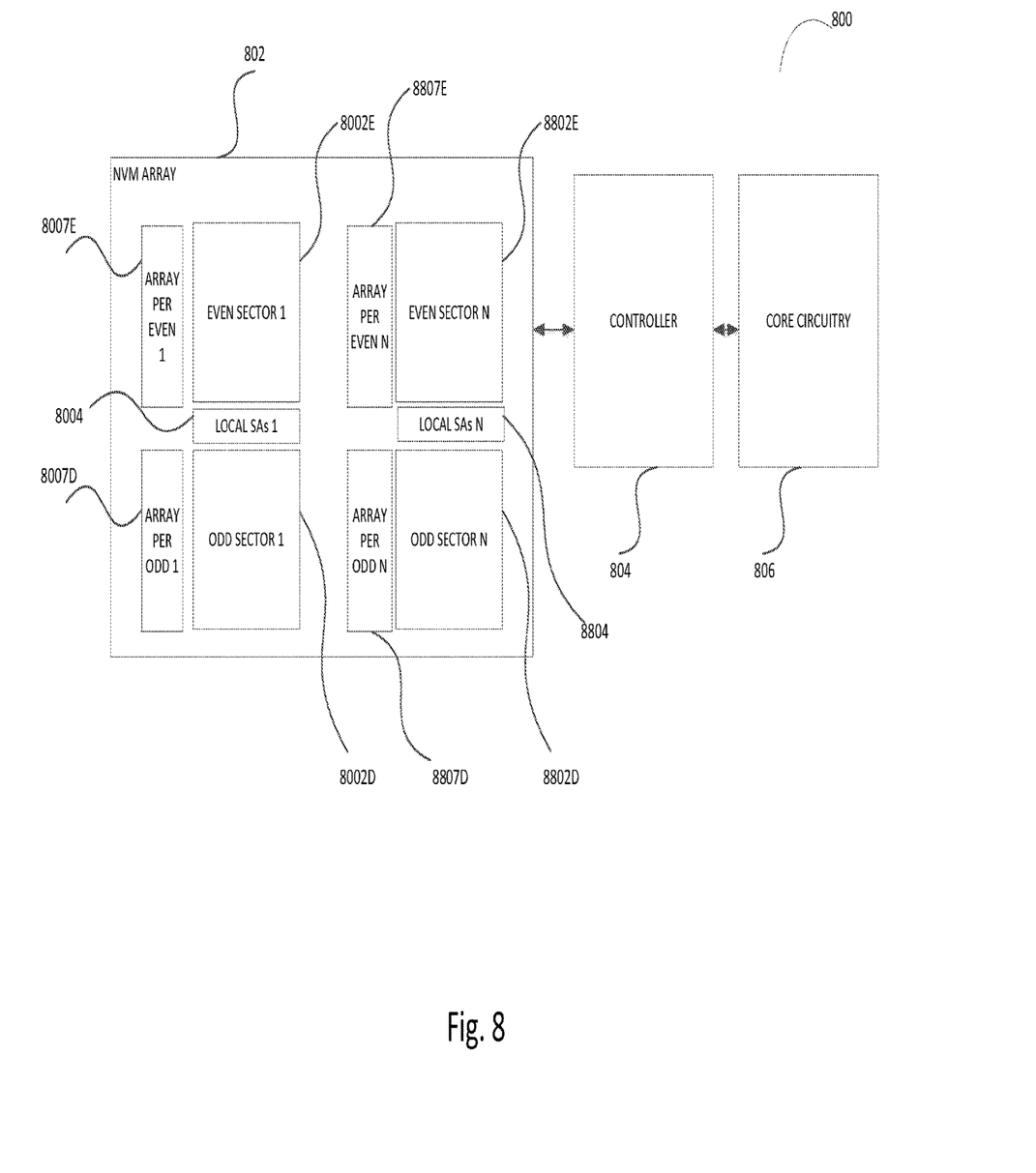
FIG. 8 depicts a block level electrical device including an NVM array, a controller and core circuitry in accordance with embodiments of the present invention.

Turning to FIG. 8, depicted is a block level electrical device 800 including an NVM array 802, a controller 804 and core circuitry 806 in accordance with some embodiments. It is understood that even sector1 8002E and even sectorN 8802E are substantially similar to even array sector 202E of FIG. 2; that odd sector1 8002D and odd sectorN 8802D are substantially similar to odd array sector 202D of FIG. 2; that array peripheral circuitry event 8007E and array peripheral circuitryN 8807 are substantially similar to row decoder 207 of FIG. 2; that array peripheral circuitry odd1 8007D and array peripheral circuitry oddN 8807D are substantially similar to row decoder 207D of FIG. 2; that local sense amplifiers) 8004 and local sense amplifiersN 8804 are substantially similar to sense amplifiers 204 of FIG. 2.

According to some embodiments, electronic device 800 may be configured to utilize or retrieve data stored on NVM array 802 via controller 804 and utilize that information in conjunction with one or more elements within core circuitry 806. Core circuitry 806 may be configured to carry out an electronic functionality at least partially based on information retrieved from NVM array 802. Controller 804 may be configured to both access the NVM device, obtain the memory data and control the core circuitry based on the memory data, or relay the memory data to core circuitry 806 for use thereon.

According to some embodiments, electronic device 800 may be a smart phone, lap top, microcontroller, computer, hand held device, camera or otherwise. Core circuitry 806 may include at least one of the following circuits: a transceiver, an antenna, a transmitter, a receiver, a GPS module, a touchscreen a CCD array, an accelerometer, a speaker and more.

Figure 9:
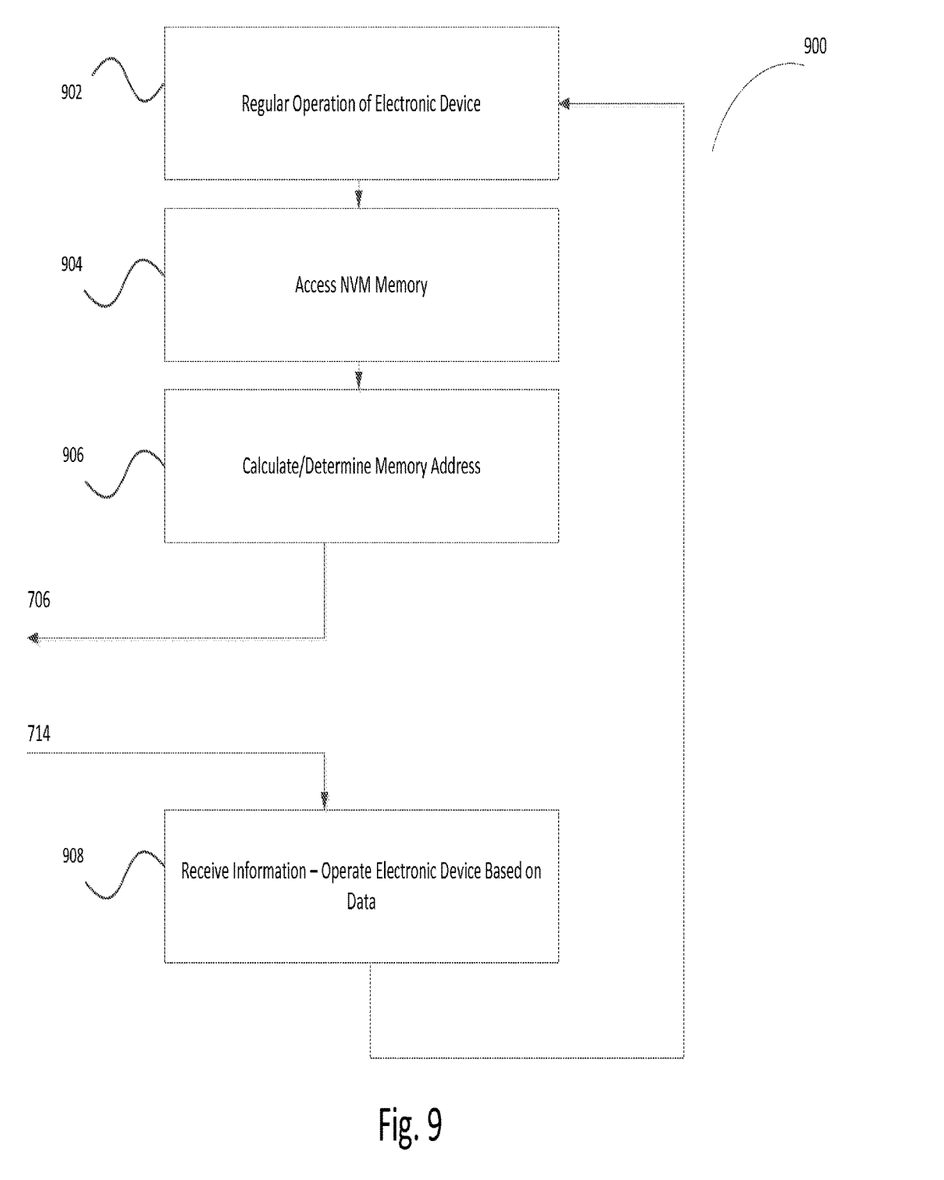
FIG. 9 is a flow chart of an example method for operating an electronic device in accordance with some embodiments of the present invention.

Turning to FIG. 9, depicted is a flow chart 900 of an example method for operating an electronic device in accordance with some embodiments. An electronic device may be turned on or may be operated in a regular state of the electronic device (step 902); the electronic device may access the NVM array in order to obtain information from the array (step 904). The electronic device may relay a requested address to be read (step 906) followed by steps 706-714 of FIG. 7, after which the electronic device may receive the requested information (step 908).

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed:

1. A method of operating a non-volatile memory (NVM) array, the method comprising:
    receiving a target current on a first bitline from a target NVM cell in a first sector having a first group of wordlines, wherein the target NVM cell is in a data-cell sub-sector of the first sector;
    generating a reference current, wherein generating the reference current comprises summing at least a first current and a second current on a second bitline, wherein the first current is from a first reference NVM cell in a second sector having a second group of wordlines, wherein the first reference NVM cell is in a reference sub-sector of the second sector, and wherein loads on the first bitline and the second bitline are matched; and
    sensing a state of the target NVM cell, wherein sensing the state of the target NVM sell comprises comparing the target current to the reference current.

2. The method of claim 1, wherein the second current is a digital current source current.

3. The method of claim 1, wherein the second current is associated with a mini-array.

4. The method of claim 1, wherein the second current is from a static reference cell of the second sector that is programmed to a predetermined level.

5. The method of claim 1, wherein the first reference NVM cell is a dynamic reference cell that is intermittently erased and reprogrammed.

6. The method of claim 1, wherein the first reference NVM cell is a dynamic reference cell that is substantially reflective of activity history of a typical NVM cell of the first sector.

7. The method of claim 1, wherein the second current is from a second reference NVM cell in the reference sub-sector of the second sector.

8. The method of claim 7, wherein the second reference NVM cell is a dynamic reference cell that is intermittently erased and reprogrammed.

9. The method of claim 7, wherein the second reference NVM cell is a dynamic reference cell that is substantially reflective of activity history of a typical NVM cell of the first sector.

10. The method of claim 7, wherein the second reference NVM cell is a dynamic reference cell that is sustained in a non-programmed state.

11. The method of claim 7, wherein generating the reference current comprises connecting the first reference NVM cell and the second reference NVM cell to the second bitline.

12. A method of operating a non-volatile memory (NVM) array, the method comprising:
receiving a target current on a first bitline from a target NVM cell in a first sector having a first group of wordlines, wherein the target NVM cell is in a data-cell sub-sector of the first sector;
generating a reference current, wherein generating the reference current comprises summing at least two currents on a second bitline from at least two reference NVM cells in a second sector having a second group of wordlines, wherein the at least two reference NVM cells are in a reference sub-sector of the second sector, and wherein loads on the first bitline and the second bitline are matched; and
sensing a state of the target NVM cell, wherein sensing the state of the target NVM sell comprises comparing the target current to the reference current.

13. The method of claim 12, wherein the at least two reference NVM cells include a static reference cell.

14. The method of claim 13, wherein the method further comprises:
prior to receiving the target current and generating the reference current, programming the static reference cell to a predetermined level.

15. The method of claim 12, wherein the at least two reference NVM cells include a dynamic reference cell.

16. The method of claim 15, wherein the method further comprises:
prior to receiving the target current and generating the reference current, programming the dynamic reference cell to a predetermined level.

17. The method of claim 15, wherein the method further comprises intermittently erasing and reprogramming the dynamic reference cell.

18. The method of claim 15, wherein the dynamic reference cell is substantially reflective of activity history of a typical NVM cell of the first sector.

19. The method of claim 15, wherein the dynamic reference cell is sustained in a non-programmed state.

20. The method of claim 12, wherein generating the reference current comprises connecting the at least two reference NVM cells to the second bitline.

* * * * *